(12) United States Patent
Oosawa et al.

(10) Patent No.: US 8,350,159 B2
(45) Date of Patent: Jan. 8, 2013

(54) PRINTED CIRCUIT BOARD AND METHOD OF MANUFACTURING THE SAME

(75) Inventors: Tetsuya Oosawa, Ibaraki (JP); Naoyuki Tanaka, Ibaraki (JP); Mitsuru Honjo, Ibaraki (JP)

(73) Assignee: Nitto Denko Corporation, Osaka (JP)

( * ) Notice: Subject to any disclaimer, the term of this patent is extended or adjusted under 35 U.S.C. 154(b) by 276 days.

(21) Appl. No.: 12/731,173

(22) Filed: Mar. 25, 2010

(65) Prior Publication Data

US 2010/0243297 A1 Sep. 30, 2010

Related U.S. Application Data

(60) Provisional application No. 61/167,887, filed on Apr. 9, 2009.

(30) Foreign Application Priority Data

Mar. 26, 2009 (JP) ................................. 2009-077246

(51) Int. Cl.
- *H05K 1/00* (2006.01)
- *H05K 1/09* (2006.01)
- *H05K 1/03* (2006.01)
- *H05K 7/00* (2006.01)
- *G11B 21/16* (2006.01)
- *G11B 5/48* (2006.01)

(52) U.S. Cl. ........ 174/254; 174/251; 174/255; 174/268; 361/749; 361/772; 360/245.8; 360/245.9

(58) Field of Classification Search .................. 174/251, 174/254, 255, 268; 361/749, 772; 360/245.8, 360/245.9

See application file for complete search history.

(56) References Cited

U.S. PATENT DOCUMENTS

| | | | |
|---|---|---|---|
| 4,767,227 A | 8/1988 | Mitsuishi et al. | |
| 4,881,832 A | 11/1989 | Mitsuishi et al. | |
| 4,913,570 A | 4/1990 | Mitsuishi et al. | |
| 4,915,524 A | 4/1990 | Mitsuishi et al. | |
| 5,048,985 A | 9/1991 | Mitsuishi et al. | |
| 5,236,266 A | 8/1993 | Mitsuishi et al. | |
| 7,092,215 B2 | 8/2006 | Someya et al. | |
| 8,134,078 B2 * | 3/2012 | Kubo | 174/254 |
| 2002/0135993 A1 | 9/2002 | Ueyama et al. | |
| 2004/0070884 A1 | 4/2004 | Someya et al. | |

FOREIGN PATENT DOCUMENTS

| | | |
|---|---|---|
| JP | 46-038858 B | 11/1971 |
| JP | 61-171191 A | 8/1986 |
| JP | 63-089274 U | 6/1988 |
| JP | 02-260598 A | 10/1990 |
| JP | 2002-016323 A | 1/2002 |
| JP | 2002-158411 A | 5/2002 |
| JP | 2004-133988 A | 4/2004 |
| JP | 2007-201263 A | 8/2007 |

* cited by examiner

*Primary Examiner* — Jayprakash N Gandhi
*Assistant Examiner* — Dion Ferguson
(74) *Attorney, Agent, or Firm* — Panitch Schwarze Belisario & Nadel LLP

(57) ABSTRACT

A base insulating layer is formed on a suspension body, and write wiring traces and read wiring traces are formed on the base insulating layer. The write wiring trace and the read wiring traces are formed on a body region of the base insulating layer, and the write wiring trace is formed on an auxiliary region of the base insulating layer. The base insulating layer is bent along a bend portion. This causes the write wiring trace to be positioned above the write wiring trace.

5 Claims, 8 Drawing Sheets

PRINTED CIRCUIT BOARD AND METHOD OF MANUFACTURING THE SAME

BACKGROUND OF THE INVENTION

1. Field of the Invention

The present invention relates to a printed circuit board and a method of manufacturing the same.

2. Description of the Background Art

Actuators are employed in drives such as hard disk drives. Such an actuator includes an arm arranged rotatably with respect to a rotation shaft and a suspension board used for a magnetic head that is attached to the arm. The suspension board is a printed circuit board for positioning the magnetic head with a desired track of a magnetic disk.

FIG. 11 is a vertical sectional view of a conventional suspension board (see JP 2004-133988 A, for example).

In the suspension board 910, a first insulating layer 904 is formed on a metal substrate 902. A write wiring trace W12 and a read wiring trace R12 are formed to be spaced apart from each other by a distance L1 on the first insulating layer 904.

A second insulating layer 905 is formed on the first insulating layer 904 to cover the write wiring trace W12 and the read wiring trace R12. On the second insulating layer 905, a write wiring trace W11 is formed at a position above the read wiring trace R12, and a read wiring trace R11 is formed at a position above the write wiring trace W12.

Each of the distance between the read wiring trace R11 and the write wiring trace W12 that are positioned one above the other and the distance between the read wiring trace R12 and the write wiring trace W11 that are positioned one above the other is L2.

In the suspension board 910 having the foregoing configuration, the distances between the write wiring traces W11, W12 and the read wiring trace R11 are substantially equal to the distances between the write wiring traces W11, W12 and the read wiring trace R12, respectively. Accordingly, it is considered that the magnitude of induced electromotive forces generated in the read wiring traces R11, R12 are substantially equal when write currents pass through the write wiring traces W11, W12. This allows a crosstalk between the write wiring traces W11, W12 and the read wiring traces R11, R12 to be reduced.

In recent years, it is desired to reduce characteristic impedance of the wiring traces in order to achieve lower power consumption of electronic equipment.

BRIEF SUMMARY OF THE INVENTION

An object of the present invention is to provide a printed circuit board in which characteristic impedance of wiring traces can be reduced and a method of manufacturing the same.

(1) According to an aspect of the present invention, a printed circuit board includes a metal support substrate, a base insulating layer arranged to have a body region formed on the metal support substrate and an auxiliary region formed to project toward the outside of the metal support substrate, a first wiring trace provided to continuously extend on the body region and the auxiliary region of the base insulating layer, a second wiring trace provided to extend on the body region of the base insulating layer, a first cover insulating layer provided on the body region of the base insulating layer to cover a portion of the first wiring trace and the second wiring trace on the body region of the base insulating layer, and a second cover insulating layer provided on the auxiliary region of the base insulating layer to cover a portion of the first wiring trace on the auxiliary region of the base insulating layer, wherein the base insulating layer is bent such that the body region and the auxiliary region overlap each other to cause the portion of the first wiring trace on the auxiliary region to be opposite to a portion of the second wiring trace with the first and second cover insulating layers sandwiched therebetween.

In the printed circuit board, the body region of the base insulating layer is formed on the metal support substrate, and the auxiliary region of the base insulating layer is formed to project toward the outside of the metal support substrate. The first wiring trace is provided to continuously extend on the body region and the auxiliary region of the base insulating layer. The second wiring trace is provided to extend on the body region of the base insulating layer. The first cover insulating layer is formed on the body region of the base insulating layer to cover the portion of the first wiring trace on the body region of the base insulating layer and the second wiring trace. The second cover insulting layer is provided on the auxiliary region of the base insulating layer to cover the portion of the first wiring trace on the auxiliary region of the base insulating layer.

In addition, the base insulating layer is bent such that the body region and the auxiliary region overlap each other to cause the portion of the first wiring trace on the auxiliary region of the base insulating layer to be opposite to the portion of the second wiring trace with the first and second cover insulating layers sandwiched therebetween.

In this case, an area in which the first and second wiring traces are opposite to each other can be increased as compared with a case where the first and second wiring traces are arranged on a common plane. This increases capacitance generated by the first and second wiring traces. As a result, characteristic impedance of the first and second wiring traces can be reduced.

Moreover, the first and second wiring traces provided on the common base insulating layer can be formed in common steps in the manufacture. This reduces the characteristic impedance of the first and second wiring traces without complicating the manufacturing steps.

Furthermore, the first and second cover insulating layers arranged between the first and second wiring traces avoid an excessively short distance between the first and second wiring traces. Accordingly, transmission loss of signals transmitted through the first and second wiring traces is prevented from increasing due to the proximity effect.

(2) The portion of the first wiring trace and the portion of the second wiring trace that are opposite to each other may each have a linear shape.

In this case, the portion of the first wiring trace on the auxiliary region and the portion of the second wiring trace can be easily caused to be opposite to each other. This allows simplified manufacturing steps.

(3) The portion of the first wiring trace and the portion of the second wiring trace that are opposite to each other may each have a curved shape.

In this case, the area in which the first wiring trace and the second wiring trace are opposite to each other can be increased. This further reduces the characteristic impedance of the first and second wiring traces.

(4) The base insulating layer may be bent at a boarder line between the body region and the auxiliary region and the base insulating layer may be bent at a portion between the boarder line and the portion of the first wiring trace to cause the portion of the first wiring trace to be opposite to the portion of the second wiring trace.

In this case, the base insulating layer as well as the first and second cover insulating layers are arranged between the first and second wiring traces. This reliably prevents an excessively short distance between the first and second wiring traces. Accordingly, transmission loss of signals transmitted through the first and second wiring traces is reliably prevented from increasing due to the proximity effect.

(5) The printed circuit board may further include a head provided on the metal substrate for reading and writing signals, wherein the first and second wiring traces are electrically connected to the head.

In this case, the printed circuit board can be used as a suspension board of a drive such as a hard disk drive.

(6) According to another aspect of the present invention, a method of manufacturing a printed circuit board includes the steps of laminating a base insulating layer on a metal support substrate such that a body region of the base insulating layer is positioned on the metal support substrate and an auxiliary region of the base insulating layer project toward the outside of the metal support substrate, forming a first wiring trace that is arranged to continuously extend on the body region and the auxiliary region of the base insulating layer and forming a second wiring trace that is arranged to extend on the body region of the base insulating layer, forming a first cover insulating layer on the body region of the base insulating layer to cover a portion of the first wiring trace and the second wiring trace on the body region of the base insulating layer, and forming a second cover insulating layer on the auxiliary region of the base insulating layer to cover a portion of the first wiring trace on the auxiliary region of the base insulating layer, and bending the base insulating layer such that the body region and the auxiliary region overlap each other to cause the portion of the first wiring trace on the auxiliary region to be opposite to a portion of the second wiring trace with the first and second cover insulating layers sandwiched therebetween.

In the manufacturing method of the printed circuit board, the base insulating layer is laminated on the metal support substrate such that the body region of the base insulating layer is positioned on the metal support substrate and the auxiliary region of the base insulating layer projects toward the outside of the metal support substrate. The first wiring trace is formed to continuously extend on the body region and the auxiliary region of the base insulating layer, and the second wiring trace is formed to extend on the body region of the base insulating layer. The first cover insulating layer is formed on the body region of the base insulating layer to cover the portion of the first wiring trace on the body region of the base insulating layer and the second wiring trace, and the second cover insulting layer is provided on the auxiliary region of the base insulating layer to cover the portion of the first wiring trace on the auxiliary region of the base insulating layer.

In addition, the base insulating layer is bent such that the body region and the auxiliary region overlap each other to cause the portion of the first wiring trace on the auxiliary region of the base insulating layer to be opposite to the portion of the second wiring trace with the first and second cover insulating layers sandwiched therebetween.

In this case, an area in which the first and second wiring traces are opposite to each other can be increased as compared with a case where the first and second wiring traces are arranged on a common plane. This increases capacitance generated by the first and second wiring traces. As a result, characteristic impedance of the first and second wiring traces can be reduced.

Moreover, the first and second wiring traces are provided on the common base insulating layer. Therefore, the first and second wiring traces can be formed in common steps in the manufacture. This reduces the characteristic impedance of the first and second wiring patterns without complicating the manufacturing steps.

Furthermore, the first and second cover insulating layers arranged between the first and second wiring traces avoid an excessively short distance between the first and second wiring traces. Accordingly, transmission loss of signals caused by the first and second wiring traces is prevented from increasing due to the proximity effect.

According to the present invention, the area in which the first and second wiring traces are opposite to each other can be increased. This increases the capacitance generated by the first and second wiring traces. As a result, the characteristic impedance of the first and second wiring traces can be reduced.

Other features, elements, characteristics, and advantages of the present invention will become more apparent from the following description of preferred embodiments of the present invention with reference to the attached drawings.

BRIEF DESCRIPTION OF THE SEVERAL VIEWS OF THE DRAWINGS

The foregoing summary, as well as the following detailed description of the invention, will be better understood when read in conjunction with the appended drawings. For the purpose of illustrating the invention, there are shown in the drawings embodiments which are presently preferred. It should be understood, however, that the invention is not limited to the precise arrangements and instrumentalities shown.

In the drawings.

DETAILED DESCRIPTION OF THE INVENTION

Figure 1:
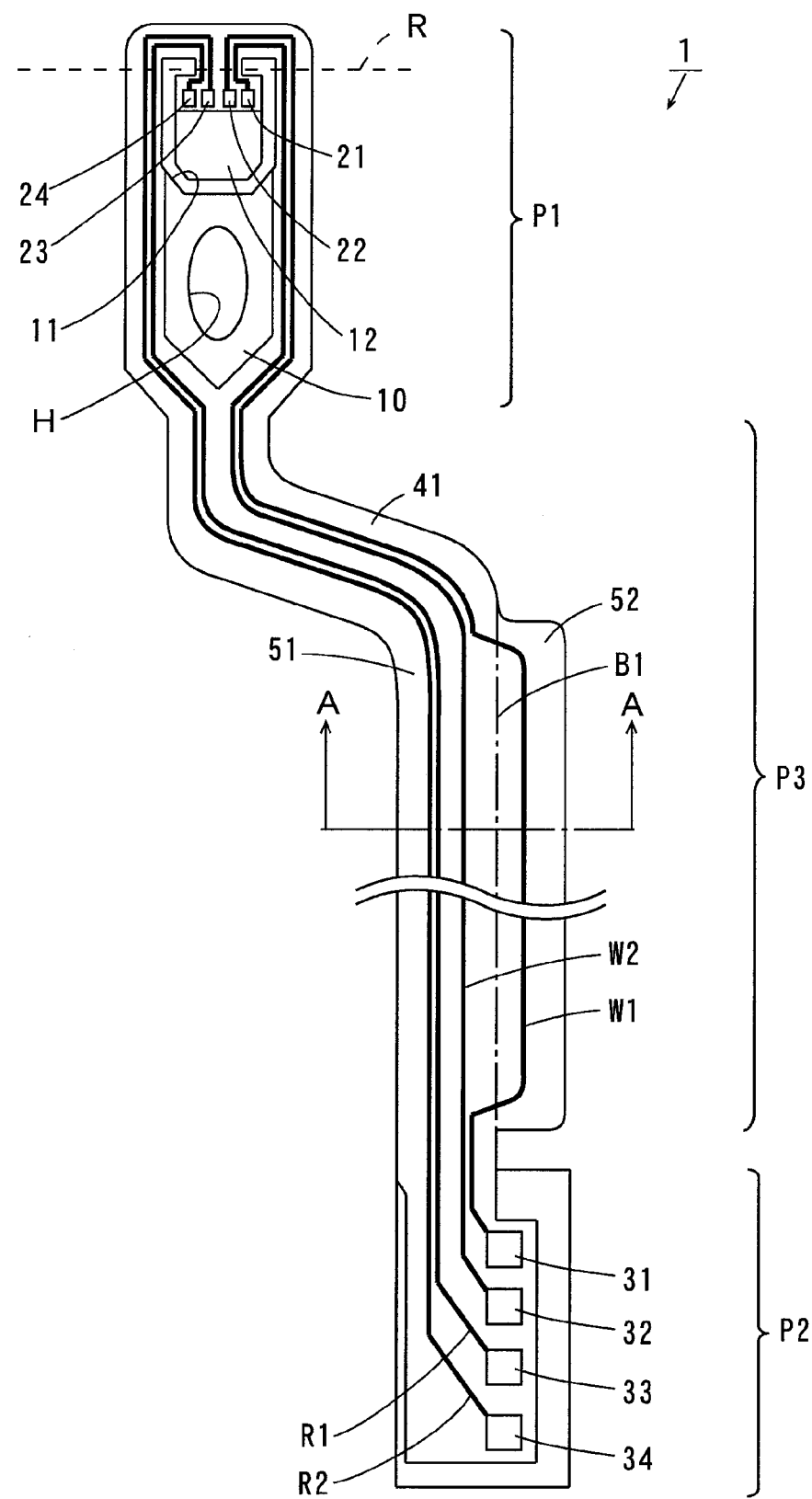
FIG. 1 is a top view of a suspension board according to one embodiment of the present invention.

Description will be made of a printed circuit board and a method of manufacturing the same according to one embodiment of the present invention while referring to the drawings. Hereinafter, description is made of the configuration of a suspension board used in an actuator of a hard disk drive as the printed circuit board according to the one embodiment of the present invention and the method of manufacturing the same.

(1) Configuration of Suspension Board

Figure 2:
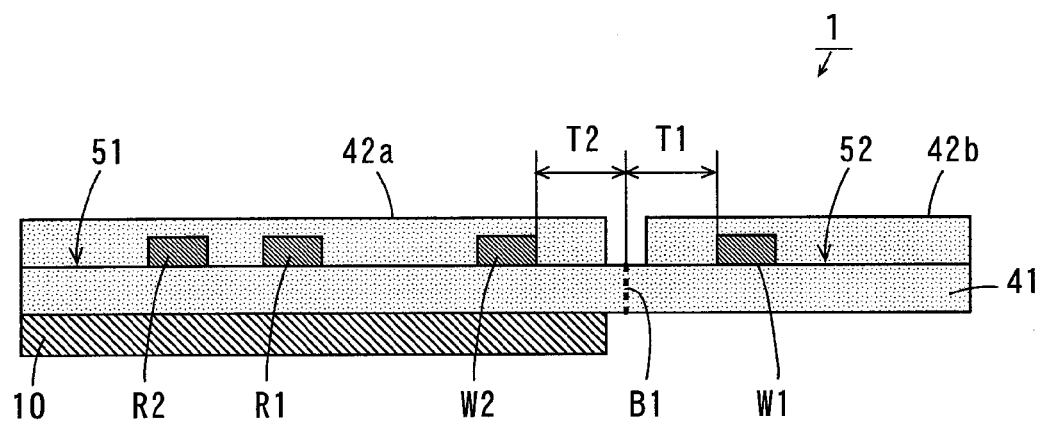
FIG. 2 is a sectional view of the suspension board taken along the line A-A of FIG. 1.

FIG. 1 is a top view of the suspension board according to one embodiment of the present invention, and FIG. 2 is a sectional view of the suspension board taken along the line A-A of FIG. 1.

As shown in FIG. 1, the suspension board 1 includes a suspension body 10 formed of a long-sized metal substrate. A base insulating layer 41 is formed in a predetermined region on the suspension body 10. Write wiring traces W1, W2 and read wiring traces R1, R2 are formed on the base insulating layer 41. A cover insulating layer is formed on the base insulating layer 41 to cover the write wiring traces W1, W2 and the read wiring traces R1, R2 as described below.

The suspension body 10 includes a tip region P1, a rear end region P2, and an intermediate region P3 that extends in a long-sized shape between the tip region P1 and the rear end region P2.

At the tip region P1 of the suspension body 10, a U-shaped opening 11 is formed, thereby providing a magnetic head supporting portion (hereinafter referred to as a tongue) 12. The tongue 12 is bent along the broken line R to form a predetermined angle with respect to the suspension body 10. Four electrode pads 21, 22, 23, 24 are formed at an end of the tongue 12. A hole H is formed in the tip region P1 of the suspension body 10.

Four electrode pads 31, 32, 33, 34 are formed in the rear end region P2 of the suspension body 10. The electrode pads 21 to 24 on the tongue 12 and the electrode pads 31 to 34 at the rear end region P2 of the suspension body 10 are electrically connected to one another through the write wiring traces W1, W2 and the read wiring traces R1, R2, respectively.

Part of the base insulating layer 41 is provided to project toward the outside of one side of the intermediate region P3 of the suspension body 10. A portion of the base insulating layer 41 on the suspension body 10 is referred to as a body region 51, and a portion of the base insulating layer 41 that projects toward the outside of the suspension body 10 is referred to as an auxiliary region 52. A bend portion B1 is provided at boundary between the body region 51 and the auxiliary region 52. A linear groove may be formed or a linear mark may be provided at the bend portion B1. There may be nothing provided at the bend portion B1 if the base insulating layer 41 can be easily bent.

The write wiring trace W2 and the read wiring traces R1, R2 are provided to extend on the body region 51 of the base insulating layer 41. The write wiring trace W1 is provided to continuously extend from the body region 51 of the base insulating layer 41 to go through the auxiliary region 52 and then return to the body region 51.

The write wiring trace W2 and the read wiring traces R1, R2 linearly extend in a portion of the body region 51 adjacent to the auxiliary region 52. On the auxiliary region 52 of the base insulating layer 41, the write wiring trace W1 linearly extends in parallel with the write wiring trace W2.

As shown in FIG. 2, the base insulating layer 41 is formed on the suspension body 10, and the write wiring traces W1, W2 and the read wiring traces R1, R2 are formed on the base insulating layer 41. The write wiring trace W2 and the read wiring traces R1, R2 are formed on the body region 51 of the base insulting layer 41, and the write wiring trace W1 is formed on the auxiliary region 52 of the base insulating layer 41.

The width of each of the write wiring traces W1, W2 and the read wiring traces R1, R2 is set sufficiently larger than the thickness of each of the write wiring traces W1, W2 and the read wiring traces R1, R2. A distance T1 between the bend portion B1 and the write wiring trace W1 is set equal to a distance T2 between the bend portion B1 and the write wiring trace W2.

A cover insulating layer 42a is formed to cover the write wiring traces W1, W2 and the read wiring traces R1, R2 on the body region 51 of the base insulating layer 41. A cover insulating layer 42b is formed to cover the write wiring trace W1 on the auxiliary region 52 of the base insulating layer 41. Note that the cover insulating layers 42a, 42b are integrated with each other at intersection portions of the write wiring trace W1 and the bend portion B1.

Figure 3:
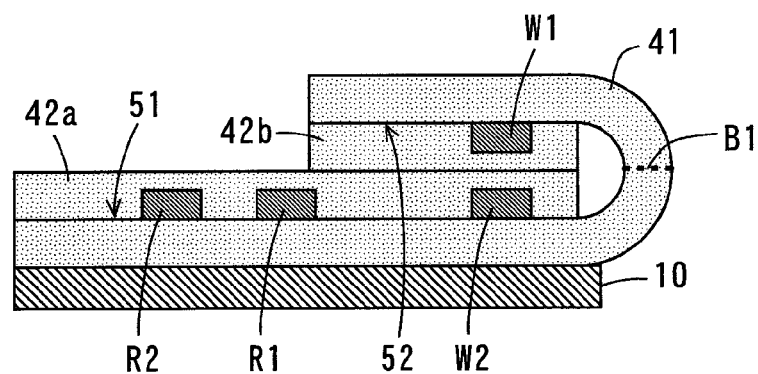
FIG. 3 is a sectional view of the suspension board with a base insulating layer being bent.

The base insulating layer 41 is bent along the bend portion B1 in the suspension board 1 of the present embodiment. FIG. 3 is a sectional view of the suspension board 1 with the base insulating layer 41 being bent.

As described above, the distance T1 between the bend portion B1 and the write wiring trace W1 and the distance T2 between the bend portion B1 and the write wiring trace W2 are equal to each other. Therefore, the base insulating layer 41 is bent along the bend portion B1 to cause the write wiring trace W1 to be positioned above the write wiring trace W2 as shown in FIG. 3. In this state, the cover insulating layer 42a and the cover insulating layer 42b are fixed to each other.

(2) Manufacturing Method

Figure 4:
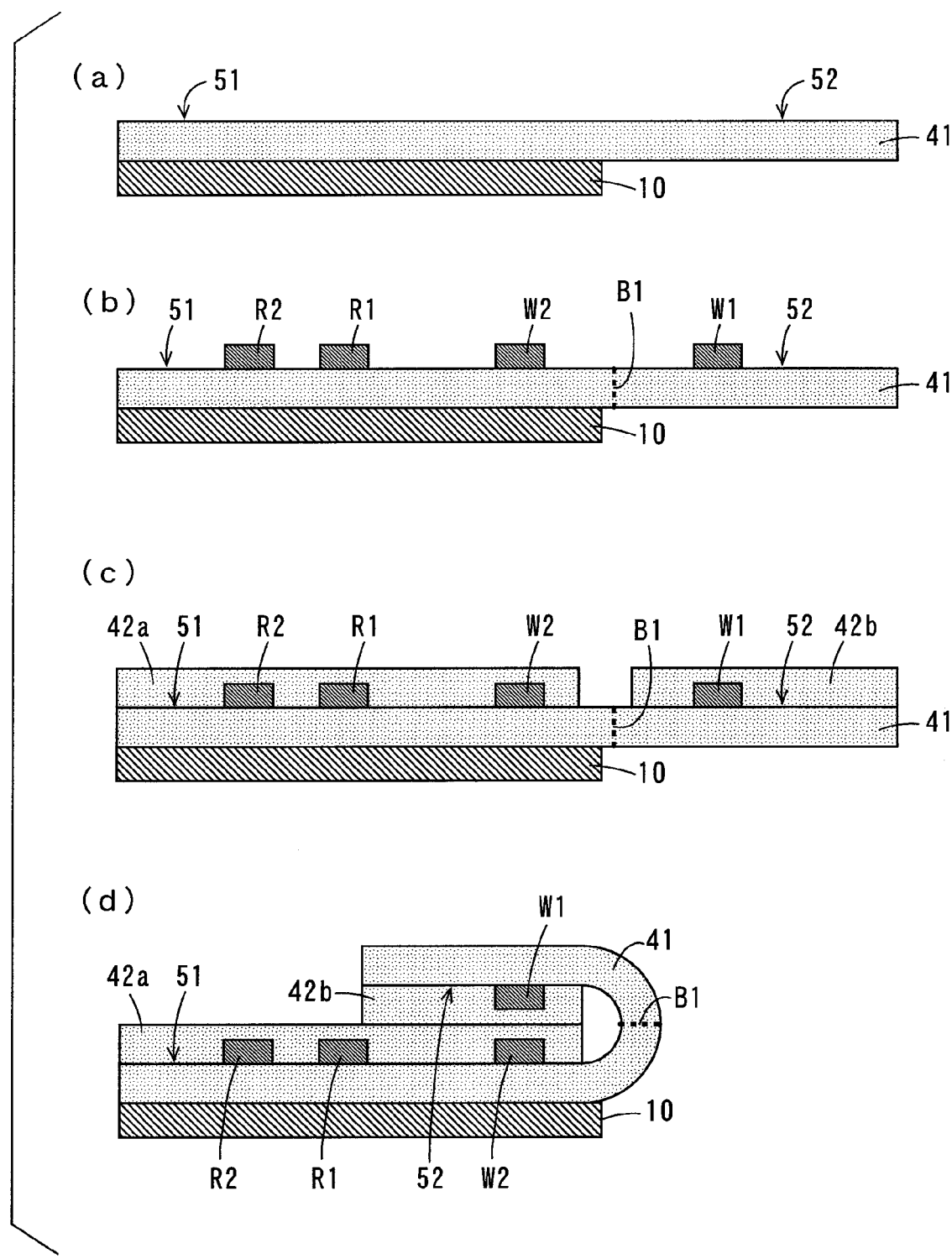
FIG. 4 is a vertical sectional view showing steps of manufacturing the suspension board.

Next, description is made of a manufacturing method of the suspension board 1. FIG. 4 is a vertical sectional view showing steps of manufacturing the suspension board 1. FIG. 4 shows manufacturing steps of a portion corresponding to the cross section taken along the line A-A of FIG. 1.

First, the base insulating layer 41 made of polyimide, for example, is laminated on the suspension body 10 made of stainless steel, for example, using an adhesive as shown in FIG. 4 (a).

The thickness of the suspension body 10 is not less than 5 μm and not more than 50 μm, for example, and preferably not less than 10 μm and not more than 30 μm. Another metal such as aluminum, or an alloy instead of stainless steel may be employed as the suspension body 10.

The thickness of the base insulating layer 41 is not less than 1 μm and not more than 15 μm, for example, and preferably not less than 2 μm and not more than 12 μm. Another insulating material such as epoxy instead of polyimide may be employed as the base insulating layer 41.

Next, the write wiring traces W1, W2 and the read wiring traces R1, R2 made of copper, for example, are formed on the base insulating layer 41 as shown in FIG. 4 (b). In this case, the write wiring trace W1 is provided to continuously extend from the body region 51 of the base insulating layer 41 to go through the auxiliary region 52 and then extend to the body region 51.

The write wiring traces W1, W2 may be formed using a semi-additive method, for example, and may be formed using another method such as a subtractive method.

The width of each of the write wiring traces W1, W2 is larger than the thickness of each of the write wiring traces W1, W2, and is preferably not more than 40 times as large as the thickness of each of the write wiring traces W1, W2. Moreover, the width of each of the write wiring traces W1, W2 is more preferably not more than 20 times as large as the thickness of each of the write wiring traces W1, W2.

The thickness of each of the write wiring traces W1, W2 and the read wiring traces R1, R2 is not less than 3 μm and not more than 16 μm, for example, and preferably not less than 6 μm and not more than 13 μm. The width of each of the write wiring traces W1, W2 and the read wiring traces R1, R2 is not less than 20 µm and not more than 200 µm, for example, and preferably not less than 30 µm and not more than 100 µm.

The material for the write wiring traces W1, W2 and the read wiring traces R1, R2 is not limited to copper. For example, another metal such as gold (Au) and aluminum or an alloy such as a copper alloy and an aluminum alloy may be used.

Next, the cover insulating layer 42b is formed on the auxiliary region 52 of the base insulating layer 41 to cover the write wiring trace W1, and the cover insulating layer 42a is formed on the body region 51 of the base insulating layer 41 to cover the write wiring traces W1, W2 and the read wiring traces R1, R2 as shown in FIG. 4 (c).

Then, the base insulating layer 1 is bent along the bend portion B1 as shown in FIG. 4 (d). The cover insulating layer 42a and the cover insulating layer 42b are fixed to each other using the adhesive or the like.

(3) Effects

The write wiring traces W1, W2 are arranged one above the other in the suspension board 1 according to the present embodiment. In addition, the width of each of the write wiring traces W1, W2 is set sufficiently larger than the thickness thereof.

Here, characteristic impedance of the write wiring traces W1, W2 becomes smaller with increasing capacitance of the write wring traces W1, W2. The capacitance becomes larger with increasing an area in which the write wiring trace W1 and the write wiring trace W2 are opposite to each other. That is, the characteristic impedance of the write wiring traces W1, W2 becomes smaller with increasing the area in which the write wiring trace W1 and the write wiring trace W2 are opposite to each other.

Therefore, the write wiring traces W1, W2 are arranged one above the other and the width of each of the write wiring traces W1, W2 is set sufficiently larger than the thickness thereof, so that the area in which the write wiring traces W1, W2 are opposite to each other is increased as compared with a case where the write wiring traces W1, W2 are arranged on a common plane. Accordingly, the characteristic impedance of the write wiring traces W1, W2 is reduced as compared with the case where the write wiring traces W1, W2 are arranged on the common plane.

Note that the write wiring traces W1, W2 are formed on the common base insulating layer 41 and the base insulating layer 41 is bent to cause the write wiring traces W1, W2 to be arranged one above the other in the present embodiment. In this case, the write wiring traces W1, W2 can be formed in respective common steps, and the cover insulating layers 42a, 42b can be formed in respective common steps. Accordingly, the number of the manufacturing steps can be reduced as compared with a case where the plurality of layers are sequentially formed to cause the write wiring traces W1, W2 to be hierarchically arranged one above the other.

In addition, the following problem may occur when the write wiring traces W1, W2 are hierarchically arranged one above the other.

Figure 5:
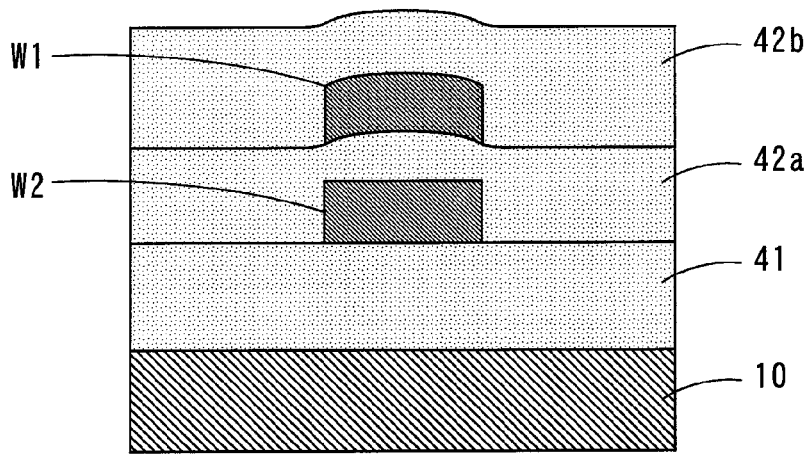
FIG. 5 is a diagram for explaining problems that may occur when write wiring traces are hierarchically arranged one above the other.

FIG. 5 is a diagram for explaining problems that may occur when the write wiring traces W1, W2 are hierarchically arranged one above the other.

In the example of FIG. 5, the write wiring trace W1 is formed on the cover insulating layer 42a above the write wiring trace W2, and the cover insulating layer 42b is formed on the cover insulating layer 42a to cover the write wiring trace W1.

In practice, a portion of the cover insulating layer 42a formed above the write wiring trace W2 is curved. Since the write wiring trace W1 is formed on the curved portion of the cover insulating layer 42a, the write wiring trace W1 is also curved along the insulating layer 42a. In this case, currents flowing through the write wiring traces W1, W2 are concentrated in edge portions of the write wiring traces W1, W2 due to the proximity effect. This leads to higher impedance of the write wiring traces W1, W2, resulting in larger transmission loss of signals caused by the write wiring traces W1, W2.

On the other hand, since both the write wiring traces W1, W2 are formed on the flat base insulating layer 41, the write wiring traces W1, W2 are not curved in the present embodiment. Therefore, an increase in the transmission loss can be prevented while the write wiring traces W1, W2 can be arranged one above the other.

Moreover, the two layers, which are the cover insulating layers 42a, 42b, are arranged between the write wiring trace W1 and the write wiring trace W2 in the present embodiment. In this case, a distance between the write wiring traces W1, W2 is prevented from being excessively short. This sufficiently suppresses the increase in the transmission loss of the signals caused by the write wiring traces W1, W2 due to the proximity effect.

Furthermore, the cover insulating layers 42a, 42b can be formed in the common steps. This sufficiently suppresses the increase in the transmission loss of the signals caused by the write wiring traces W1, W2 in a shorter manufacturing period than a case where the thickness of one insulating layer is increased.

(4) Inventive Example and Comparative Example

(4-1) Inventive Example

The suspension board 1 shown in FIGS. 1 and 2 was prepared as an inventive example. Note that copper was employed as the material for the write wiring traces W1, W2, stainless steel was employed as the material for the suspension body 10, and polyimide was employed as the material for the base insulating layer 41 and the cover insulating layers 42a, 42b. The width of each of the write wiring traces W1, W2 was 35 µm, and the thickness thereof was 18 µm.

The thickness of the suspension body 10 was 18 µm, the thickness of the base insulating layer 41 was 10 µm, and the thickness of each of the cover insulating layers 42a, 42b was 5 µm.

(4-2) Comparative Example

Figure 6:
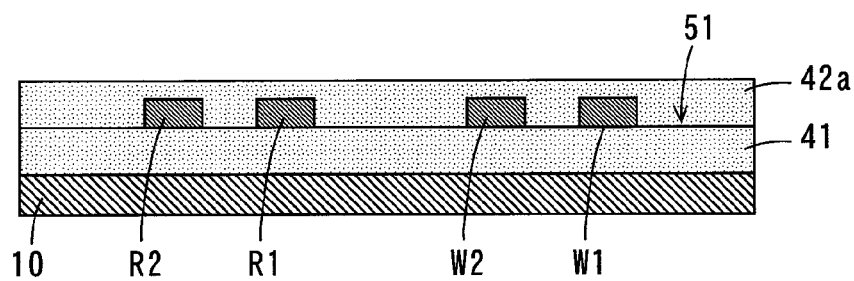
FIG. 6 is a schematic sectional view of the suspension board that is prepared as a comparative example.

FIG. 6 is a schematic sectional view of a suspension board that is prepared as a comparative example. FIG. 6 shows a cross section of a portion corresponding to the cross section taken along the line A-A of FIG. 1 in the suspension board of the comparative example. The suspension board 100 of FIG. 6 is different from the suspension board 1 of the inventive example in the following points.

In the suspension board 100, the write wiring trace W1 was formed on the body region 51 of the base insulating layer 41. In addition, the auxiliary region 52 was not provided in the base insulating layer 41, and the base insulating layer 41 was not bent. Note that the distance between the write wiring trace W1 and the write wiring trace W2 was 20 µm.

(4-3) Evaluation

In the suspension boards 1, 100 of the inventive example and the comparative example, the characteristic impedance of the write wiring traces W1, W2 was examined.

The results show the characteristic impedance of the write wiring traces W1, W2 was about 40Ω in the suspension board 1 of the inventive example. On the other hand, the characteristic impedance of the write wiring traces W1, W2 was about 80Ω in the suspension board 100 of the comparative example.

Accordingly, it can be seen that the characteristic impedance of the write wiring traces W1, W2 was reduced by arranging the write wiring traces W1, W2 one above the other as compared with the case where the write wiring traces W1, W2 were arranged on the common plane.

(5) Modifications (5-1)

Figure 7:
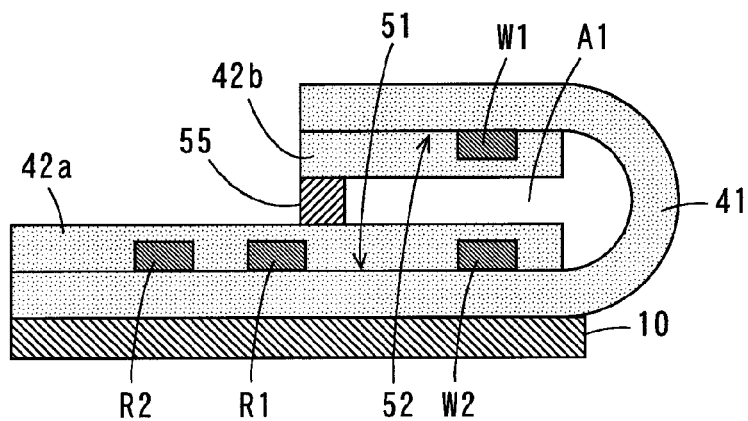
FIG. 7 is a sectional view for explaining a modification of the suspension board.

FIG. 7 is a sectional view for explaining a modification of the suspension board 1 according to the foregoing embodiment.

In the example of FIG. 7, only an end of the cover insulating layer 42b is bonded to the cover insulating layer 42a with an adhesive layer 55 sandwiched therebetween such that an air layer A1 is formed between the cover insulating layers 42a, 42b while the base insulating layer 41 is bent along the bend portion B1.

(5-2)

Figure 8:
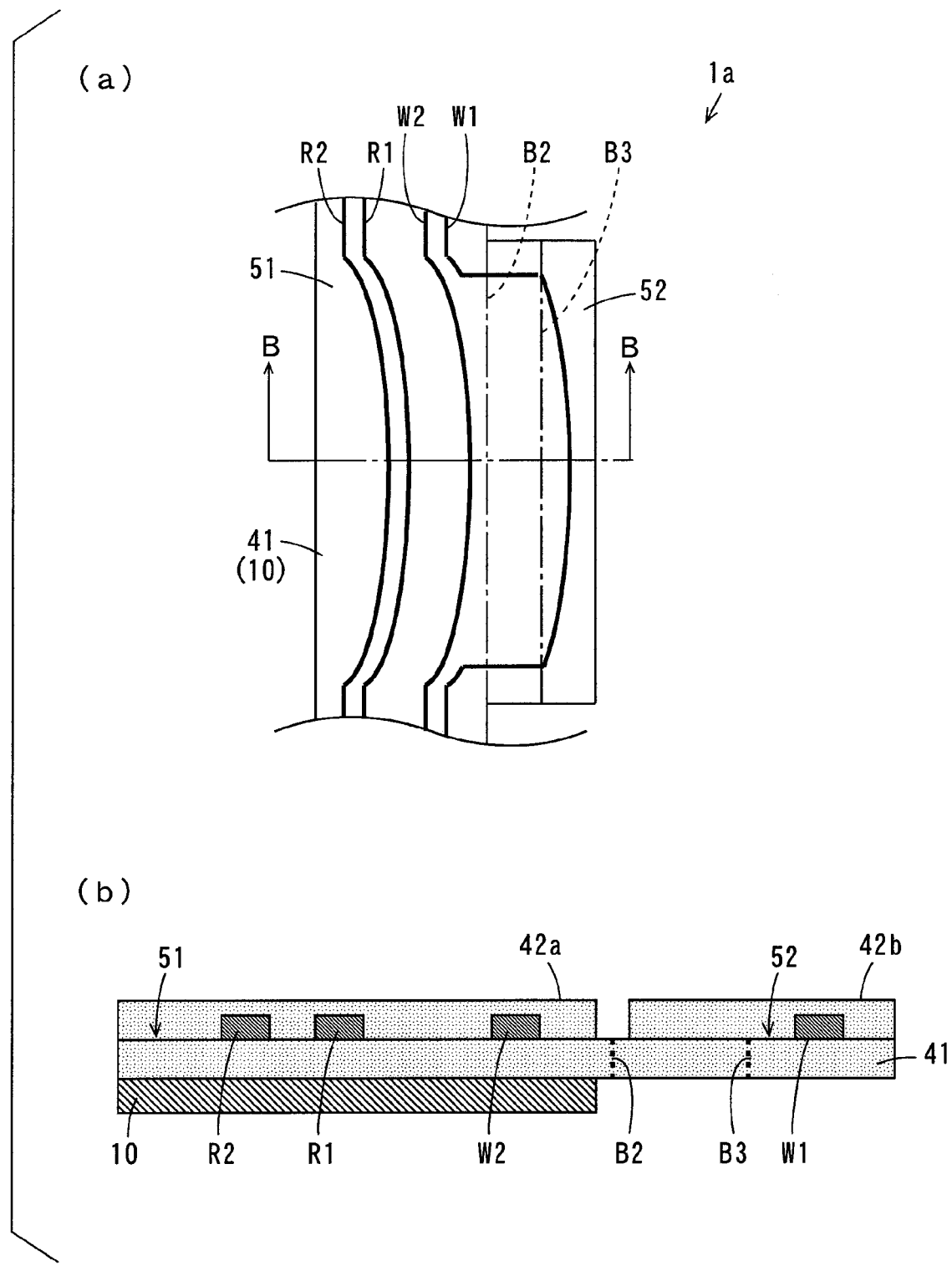
FIG. 8 shows a plan view and a sectional view for explaining another modification of the suspension board.

FIG. 8 shows a plan view and a sectional view for explaining another modification of the suspension board 1 according to the foregoing embodiment. Note that FIG. 8 (a) shows the auxiliary region 52 of the base insulating layer 41 and an adjacent portion thereof, and FIG. 8 (b) shows a cross section taken along the line B-B of FIG. 8 (a). Description is made of a suspension board 1a of FIG. 8 while referring to differences from the suspension board 1 of the foregoing embodiment.

In the suspension board 1a of FIG. 8, the write wiring trace W2 and the read wiring traces R1, R2 each extend in a curved shape in a portion of the body region 51 adjacent to the auxiliary region 52. The write wiring trace W1 extends in a curved shape on the auxiliary region 52 of the base insulating layer 41. Curved portions of the write wiring traces W1, W2 have the same shape.

A bend portion B2 is provided at boundary between the body region 51 and the auxiliary region 52 of the base insulating layer 41. In addition, a bend portion B3 is provided in parallel with the bend portion B2 in the auxiliary region 52 of the base insulating layer 41.

In the suspension board 1a, the base insulating layer 41 is bent along the bend portions B2, B3.

Figure 9:
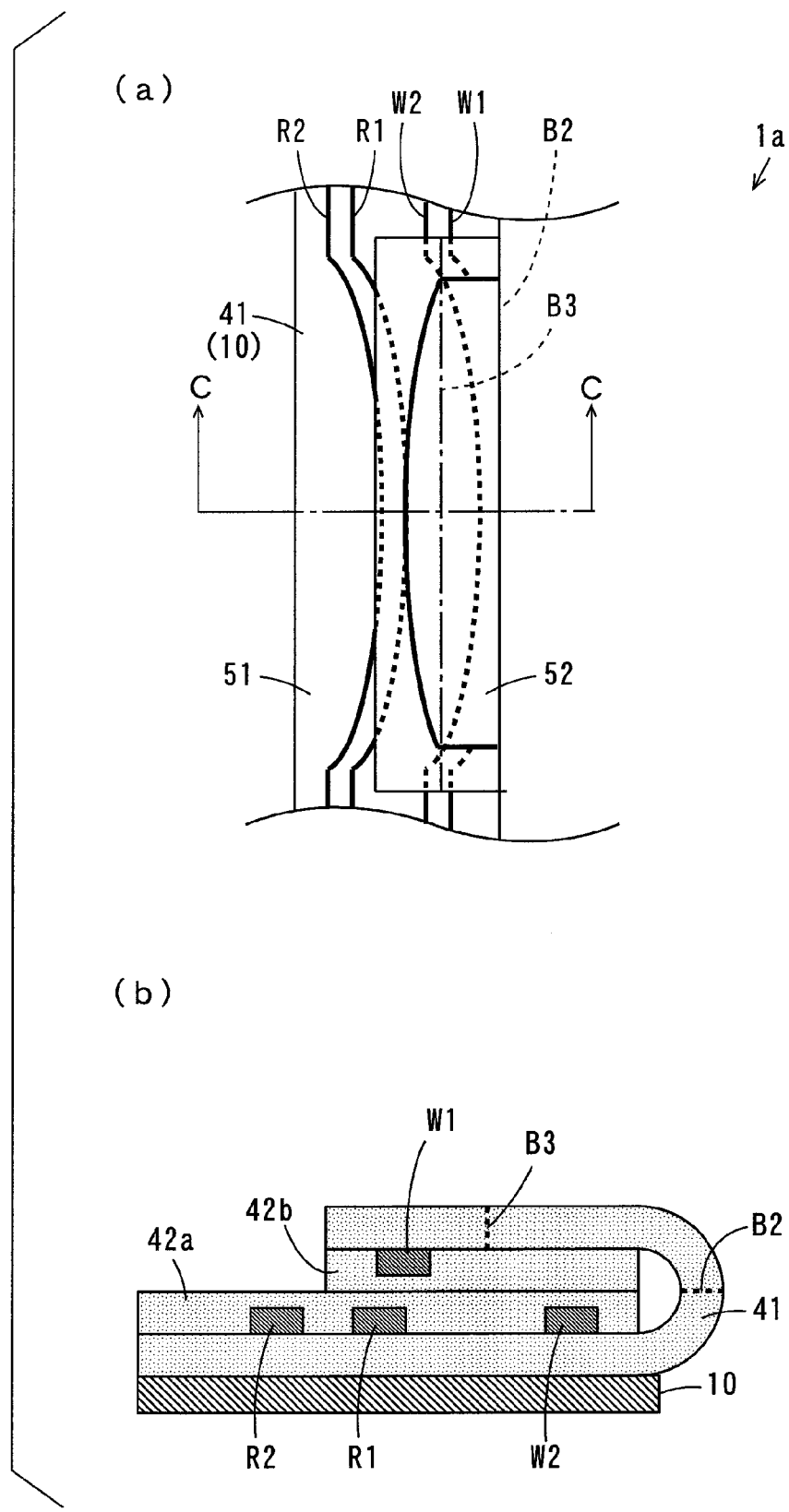
FIG. 9 shows a plan view and a section view for explaining the another modification of the suspension board.
Figure 10:
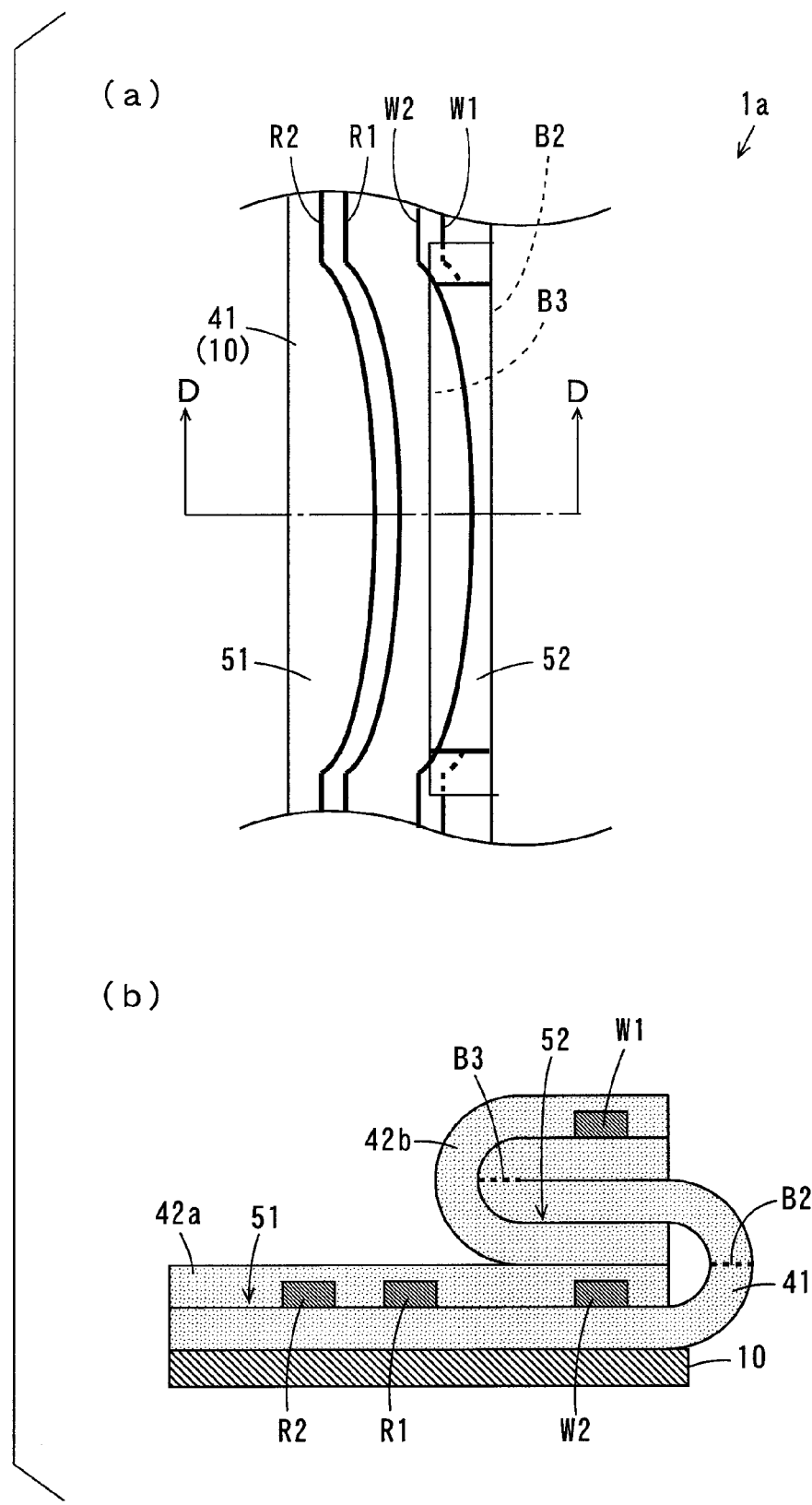
FIG. 10 shows a plan view and a section view for explaining the another modification of the suspension board.
Figure 11:
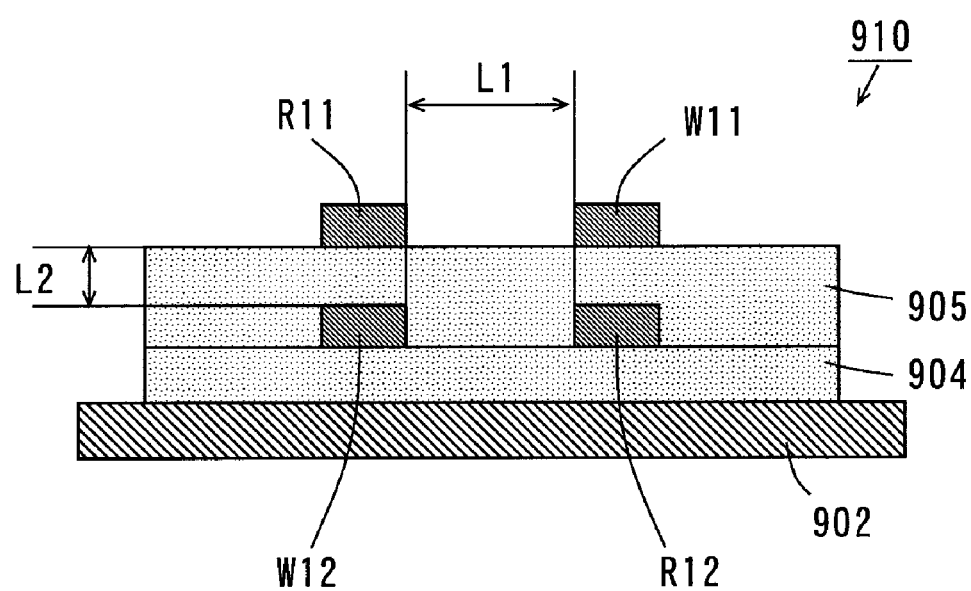
FIG. 11 is a vertical sectional view of a conventional suspension board.

FIG. 9 (a) shows a plan view of the suspension board 1a with the base insulating layer 41 being bent along the bend portion B2, and FIG. 9 (b) shows a cross section taken along the line C-C of FIG. 9 (a). FIG. 10 (a) shows a plan view of the suspension board 1a with the base insulating layer 41 being bent along the bend portions B2, B3, and FIG. 10 (b) shows a cross section taken along the line D-D of FIG. 10 (a).

As shown in FIGS. 9 (a) and (b), the write wiring trace W1 and the write wiring trace W2 hardly overlap each other when the base insulating layer 41 is bent along the bend portion B2. In this case, since the area in which the write wiring trace W1 and the write wring trace W2 are opposite to each other is small, the characteristic impedance of the write wiring traces W1, W2 cannot be sufficiently reduced.

Therefore, the base insulating layer 41 is further bent along the bend portion B3 as shown in FIGS. 10 (a) and (b). This causes the write wiring trace W1 and the write wiring trace W2 to overlap each other. Thus, the area in which the write wiring trace W1 and the write wiring trace W2 are opposite to each other is increased to sufficiently reduce the characteristic impedance of the write wiring traces W1, W2.

In addition, the base insulating layer 41 is bent along the bend portions B2, B3, so that the base insulating layer 41 is doubled and the cover insulating layers 42a, 42b are arranged between the write wiring traces W1, W2. Accordingly, the distance between the write wiring traces W1, W2 is more sufficiently ensured, and the increase in the transmission loss of the signals caused by the write wiring traces W1, W2 due to the proximity effect is more sufficiently suppressed.

(5-3)

While the base insulating layer 41 is bent along the bend portions B2, B3 to cause the portions of the write wiring traces W1, W2 in the curved shape to overlap each other in the example of FIGS. 8 to 10, the portions of the write wiring traces W1, W2 in the curved shape may be caused to overlap each other by another method.

For example, the curved shape of the write wiring trace W2 formed on the body region 51 and the curved shape of the write wring trace W1 formed on the auxiliary region 52 are symmetrically set with respect to a boarder line between the body region 51 and the auxiliary region 52. In this case, the base insulating layer 41 is bent along the boarder line between the body region 51 and the auxiliary region 52 to allow the portions of the write wiring traces W1, W2 in the curved shape to overlap each other.

(5-4)

In a suspension board in which the write wiring traces W1, W2 are linearly formed on the auxiliary region 52 and the portion on the body region 51 adjacent to the auxiliary region 52 such as the suspension board 1 shown in FIGS. 1 and 2, the base insulating layer 41 may be bent at two portions similarly to the modification shown in FIGS. 7 to 9.

In this case, the thickness of the insulating layer between the write wiring traces W1, W2 is increased, so that the increase in the transmission loss of the signals caused by the write wiring traces W1, W2 can be sufficiently suppressed.

(6) Correspondences Between Elements in the Claims and Parts in Embodiments

In the following paragraphs, non-limiting examples of correspondences between various elements recited in the claims below and those described above with respect to various preferred embodiments of the present invention are explained.

In the foregoing embodiment, the suspension body 10 is an example of a metal support substrate, the write wiring trace W1 is an example of a first wiring trace, the write wiring trace W2 is an example of a second wiring trace, the cover insulating layer 42a is an example of a first cover insulating layer, the cover insulating layer 42b is an example of a second cover insulating layer, and the tongue 12 is an example of a head.

As each of various elements recited in the claims, various other elements having configurations or functions described in the claims can be also used.

While preferred embodiments of the present invention have been described above, it is to be understood that variations and modifications will be apparent to those skilled in the art without departing the scope and spirit of the present invention. The scope of the present invention, therefore, is to be determined solely by the following claims.

We claim:

1. A printed circuit board comprising:
a metal support substrate;
a base insulating layer arranged to have a body region formed on said metal support substrate and an auxiliary region formed to project toward the outside of said metal support substrate;
a first write wiring trace provided to continuously extend on said body region and said auxiliary region of said base insulating layer;
a first read wiring trace, a second read wiring trace and a second write wiring trace provided to extend on said body region of said base insulating layer;
a first cover insulating layer provided on said body region of said base insulating layer to cover a portion of said first write wiring trace, said first read wiring trace, said second read wiring trace and the second write wiring trace on said body region of said base insulating layer; and
a second cover insulating layer provided on said auxiliary region of said base insulating layer to cover a portion of said first write wiring trace on said auxiliary region of said base insulating layer, wherein
said second write wiring trace is provided at a position closer to said auxiliary region than to said first and second read wiring traces, and
said base insulating layer is bent such that said body region and said auxiliary region overlap each other to cause the portion of said first write wiring trace on said auxiliary region to be opposite to a portion of said second write wiring trace with said first and second cover insulating layers sandwiched therebetween.

2. The printed circuit board according to claim 1, wherein the portion of said first write wiring trace and the portion of said second write wiring trace that are opposite to each other each have a linear shape.

3. The printed circuit board according to claim 1, wherein the portion of said first write wiring trace and the portion of said second write wiring trace that are opposite to each other each have a curved shape.

4. The printed circuit board according to claim 1, wherein said base insulating layer is bent at a boarder line between said body region and said auxiliary region and said base insulating layer is bent at a portion between said boarder line and the portion of said first write wiring trace on said auxiliary region to cause the portion of said first write wiring trace on said auxiliary region to be opposite to the portion of said second write wiring trace.

5. The printed circuit board according to claim 1, further comprising a head provided on said metal support substrate for reading and writing signals, wherein
said first and second write wiring traces are electrically connected to said head.

* * * * *